United States Patent
Chen

(10) Patent No.: US 7,830,207 B2
(45) Date of Patent: Nov. 9, 2010

(54) AMPLIFIER CIRCUIT

(75) Inventor: Jia Chen, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 22 days.

(21) Appl. No.: 12/427,944

(22) Filed: Apr. 22, 2009

(65) Prior Publication Data
US 2009/0267691 A1    Oct. 29, 2009

(30) Foreign Application Priority Data
Apr. 23, 2008    (JP) .............................. 2008-112147

(51) Int. Cl.
*H03F 3/45*    (2006.01)
(52) U.S. Cl. ...................................... 330/253; 330/255
(58) Field of Classification Search ................. 330/253, 330/257, 255, 261
See application file for complete search history.

(56) References Cited

U.S. PATENT DOCUMENTS 6,008,695 A * 12/1999 Sichert et al. ............... 330/253
7,423,486 B2 * 9/2008 Matsushita .................. 330/261
7,583,752 B2 * 9/2009 Teng et al. .................. 375/295

FOREIGN PATENT DOCUMENTS

| JP | 61-289717 | 12/1986 |
|---|---|---|
| JP | 62-160815 | 7/1987 |
| JP | 08-077779 | 3/1996 |
| JP | 2000-306382 | 11/2000 |

* cited by examiner

*Primary Examiner*—Henry K Choe
(74) *Attorney, Agent, or Firm*—Young & Thompson

(57) ABSTRACT

A differential amplifier circuit 110 composed of an inverter is connected to the power supply voltage VCC and the ground voltage GND through a NMOS transistor 142 and a PMOS transistor 144 respectively. The NMOS transistor 142 is connected to the control signal terminal PS, and the PMOS transistor 144 is connected to control signal terminal PS through an inverter 150. The NMOS transistor 142 and the PMOS transistor 144 are controlled such that they can be simultaneously cut off by a control signal from the control signal terminal PS. In this way, the power consumption of the amplifier is reduced.

9 Claims, 8 Drawing Sheets

AMPLIFIER CIRCUIT

BACKGROUND

1. Field of the Invention

The present invention relates to an amplifier circuit.

2. Description of Related Art

CMOS (Complementary Metal Oxide Semiconductor) technology is often used in portable electronic devices in which low power supply voltage and low power consumption are required, and therefore CMOS amplifiers have been proposed from various viewpoints.

FIG. 7 is a simplified schematic view of an amplifier disclosed in Japanese Unexamined Patent Application Publication Nos. 62-160815 and 61-289717 (Patent documents 1 and 2). The amplifier 10 is composed of a CMOS push-pull inverter (hereinafter, simply called "inverter") 11 and a negative feedback resistor 14. The inverter 11 includes an NMOS transistor 12 and a PMOS transistor 13, which are connected to each other at their drains. The source of the NMOS transistor 12 is connected to a power supply voltage VCC and the source of the PMOS transistor 13 is connected to a ground voltage GND. Furthermore, the gates of both the NMOS transistor 12 and the PMOS transistor 13 are connected to an input voltage VIN, so that they are driven by the input voltage VIN. Furthermore, the negative feedback resistor 14 is connected between the input voltage VIN and the output voltage VOUT of the inverter 11.

The amplifier 10 can produces the maximum voltage gain when both the NMOS transistor 12 and the PMOS transistor 13 are operated in the saturation region.

In the amplifier 10 shown in FIG. 7, the presence of the negative feedback resistor 14 can stabilize the DC bias point in the amplifier 10. Furthermore, the negative feedback resistor 14 can provides another useful effect of reducing the output resistance of the amplifier 10 in a state where the inverter 11 attains a sufficient gain in the operating band.

Furthermore, Japanese Unexamined Patent Application Publication Nos. 8-77779 and 2000-306382 (Patent documents 3 and 4) propose differential amplifiers. FIG. 8 is a simplified schematic view of a differential amplifier disclosed in Patent documents 3 and 4. A differential amplifier 30 shown in FIG. 8 includes two amplifiers 10 each of which is shown in FIG. 7. Because of the differential structure, the differential amplifier 30 can provide a higher gain than the gain produced by the amplifier 10 shown in FIG. 7.

SUMMARY

The present inventors have found a following problem. In recent years, mobile communication devices driven by batteries have become widespread, and thus reduction in the power consumption has been required in these mobile communication devices. However, each of the above-described amplifiers consumes an electrical current even when no signal is input, and therefore a certain amount of electrical power is wasted.

A first exemplary aspect of an embodiment of the present invention is an amplifier circuit. This amplifier circuit includes a first switch circuit, a second switch circuit, and an amplifier.

The amplifier is composed of an inverter(s), and connected to a first power supply voltage and a second power supply voltage through the first switch circuit and second switch circuit respectively. The first and second switch circuits can be cut off simultaneously.

Note that entities obtained by expressing the above-described amplifier in accordance with an exemplary aspect of the present invention as methods or apparatuses are also considered to fall within the scope of the invention.

The present invention can reduce the power consumption of a CMOS amplifier.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
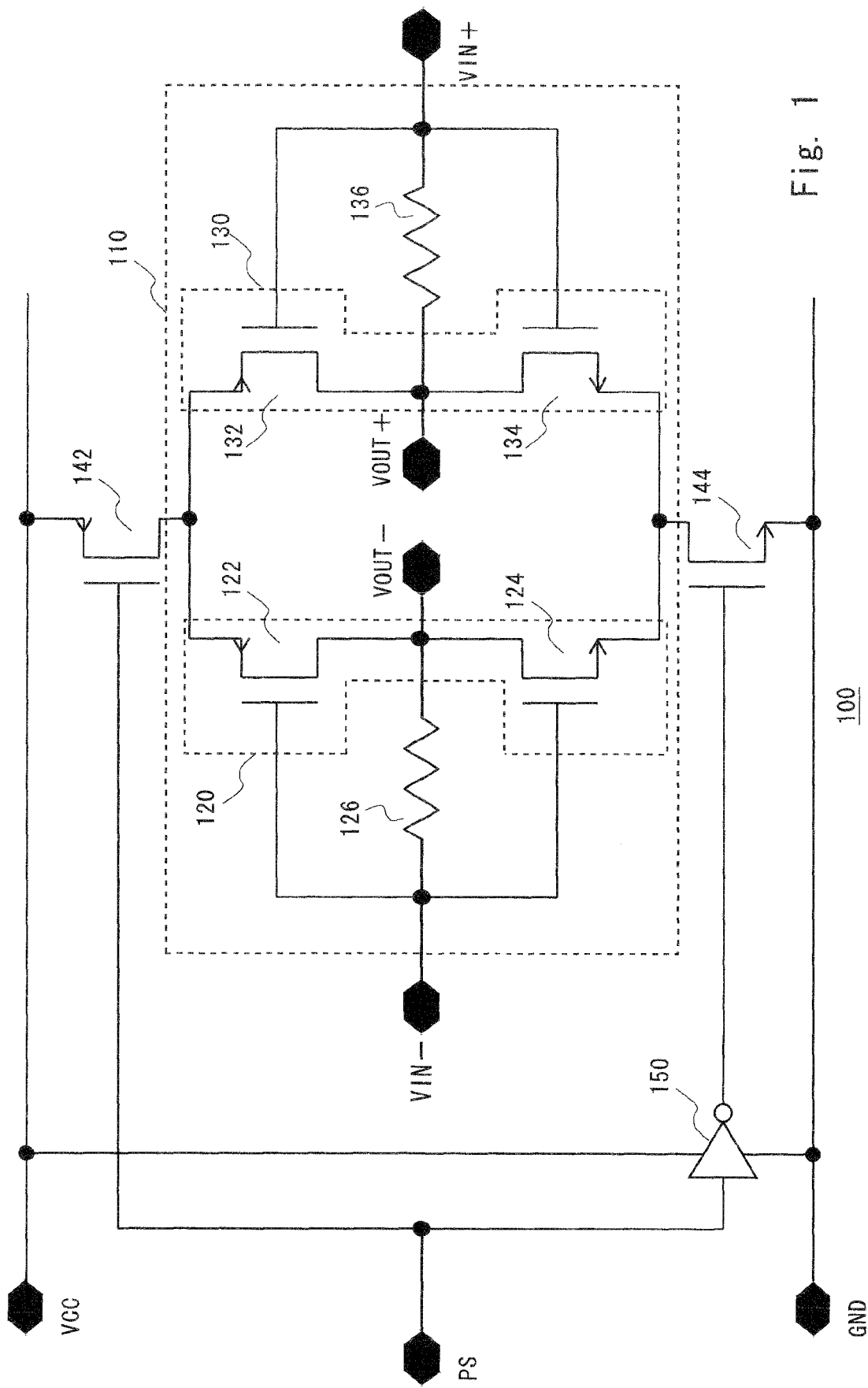
FIG. 1 shows an amplifier circuit in accordance with an exemplary embodiment of the present invention.

Exemplary embodiments of the present invention are explained hereinafter with reference to the drawings. FIG. 1 shows an amplifier circuit 100 in accordance with an exemplary embodiment of the present invention. The amplifier circuit 100 includes a differential amplifier circuit 110, an NMOS transistor 142, a PMOS transistor 144, and an inverter 150. The differential amplifier circuit 110 is composed of push-pull inverters 120 and 130, to which complementary input signals VIN− and VIN+ are respectively input, and negative feedback resistors 126 and 136 are provided for the push-pull inverters 120 and 130 respectively.

The push-pull inverter 120 includes an NMOS transistor 122 and a PMOS transistor 124, which are connected to each other at their drains. The gates of the NMOS transistor 122 and the PMOS transistor 124 are connected to the input voltage VIN−. Furthermore, the source of the NMOS transistor 122 is connected to a power supply voltage VCC through an NMOS transistor 142, and the source of the PMOS transistor 124 is connected to a ground voltage GND through a PMOS transistor 144. Furthermore, the negative feedback resistor 126 is connected between the input VIN− and the output VOUT− of the push-pull inverter 120.

The push-pull inverter 130 includes an NMOS transistor 132 and a PMOS transistor 134, which are connected to each other at their drains. The gates of the NMOS transistor 132 and the PMOS transistor 134 are connected to the input voltage VIN+. The source of the NMOS transistor 132 is connected to the power supply voltage VCC through the NMOS transistor 142, and the source of the PMOS transistor 124 is connected to the ground voltage GND through the PMOS transistor 144. Furthermore, the negative feedback resistor 136 is connected between the input VIN+ and the output VOUT+ of the push-pull inverter 130.

The gate of the NMOS transistor 142 is connected to a control signal terminal PS, the source is connected to the power supply voltage VCC, and the drain is connected to the sources of the NMOS transistors 122 and 132. The On/Off states of the NMOS transistor 142 is controlled by a control signal from the control signal terminal PS.

The gate of the PMOS transistor 144 is connected to the control signal terminal PS through the inverter 150, the source is connected to the ground voltage GND, and the drain is connected to the drains of the PMOS transistors 124 and 134. The On/Off states of the PMOS transistor 144 is controlled by the inverted signal of the control signal from the control signal terminal PS.

The input of the inverter 150 is connected to the control signal terminal PS, and the output is connected to the gate of the PMOS transistor 144. The inverter 150 inverts the control signal from the control signal terminal PS, and outputs the inverted signal to the gate of the PMOS transistor 144.

That is, when the control signal from the control signal terminal PS is "High", the NMOS transistor 142 and the PMOS transistor 144 are both turned on, and when the control signal from the control signal terminal PS is "Low", the NMOS transistor 142 and the PMOS transistor 144 are both turned off. The amplifier circuit 100 has two operating modes corresponding to the On/Off states of the NMOS transistor 142 and the PMOS transistor 144. In the following explanation, the mode in which the NMOS transistor 142 and the PMOS transistor 144 are both in the On state is referred to as "normal mode", and the mode in which the NMOS transistor 142 and the PMOS transistor 144 are both in the Off state is referred to as "power-saving mode".

In the power-saving mode, since the NMOS transistor 142 and the PMOS transistor 144 are both in the Off state, no electricity is supplied to the amplifier circuit 100 and the current consumption is eliminated. Therefore, when no signal is input, the power consumption in the differential amplifier circuit 110 is eliminated by setting the control signal from the control signal terminal PS to the "High" level, and therefore the power consumption can be reduced. In the following explanation, the current consumption in the no-signal state is referred to as "circuit current".

When the control signal from the control signal terminal PS is changed from the High level to the Low level, the amplifier circuit 100 enters the normal mode. In the normal operating mode, when a differential signals VIN− and VIN+ are input, the differential amplifier circuit 110 starts a differential amplification operation.

Figure 2:
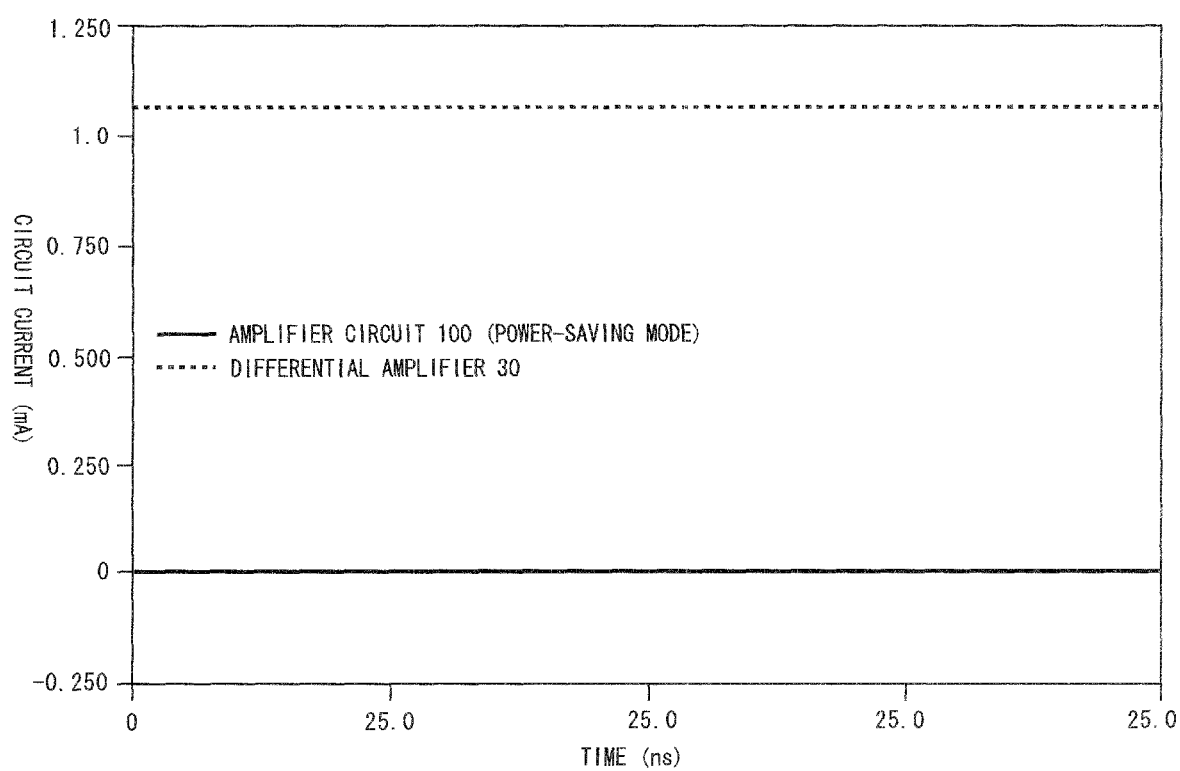
FIG. 2 is a graph comparing a circuit current in the amplifier circuit shown in FIG. 1 with that in a differential amplifier circuit in the related art.

FIG. 2 shows a circuit current of the amplifier circuit 100 operating in the power-saving mode and a circuit current of the differential amplifier 30. Note that FIG. 2 shows a case where the same transistors and the same negative feedback resistors are used in both the differential amplifier circuit 110 of the amplifier circuit 100 and the differential amplifier 30.

As shown in FIG. 2, the circuit current of the amplifier circuit 100 operating in the power-saving mode is zero and thus consuming no electrical power, whereas the differential amplifier 30 consumes a circuit current of around 1.1 mA. Therefore, the amplifier circuit 100 can reduce the power consumption of an electronic device in which the amplifier circuit 100 is installed, and it gives an advantageous effect, especially, to mobile communication devices driven by batteries, which require low power consumption.

The amplifier circuit 100 can not only achieve lower power consumption by the power-saving mode, but also provide a useful effect that the PSRR (Power Supply Ripple Rejection) rate can be increased in the normal operating mode. With regard to this effect, the PSRR of the amplifier 10 shown in FIG. 7 is firstly explained hereinafter.

Figure 3:
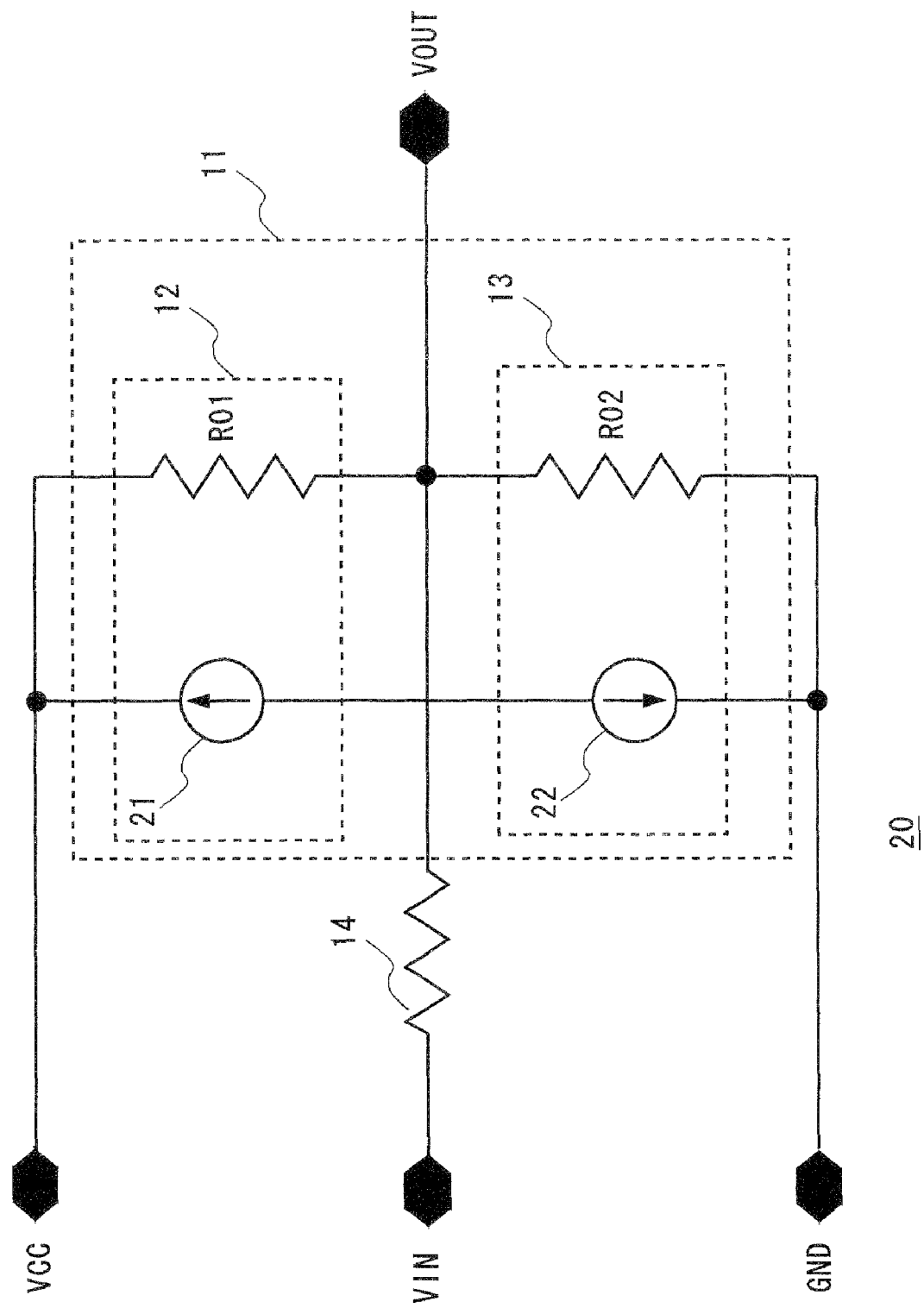
FIG. 3 shows an equivalent circuit to an amplifier circuit in the related art.
Figure 7:
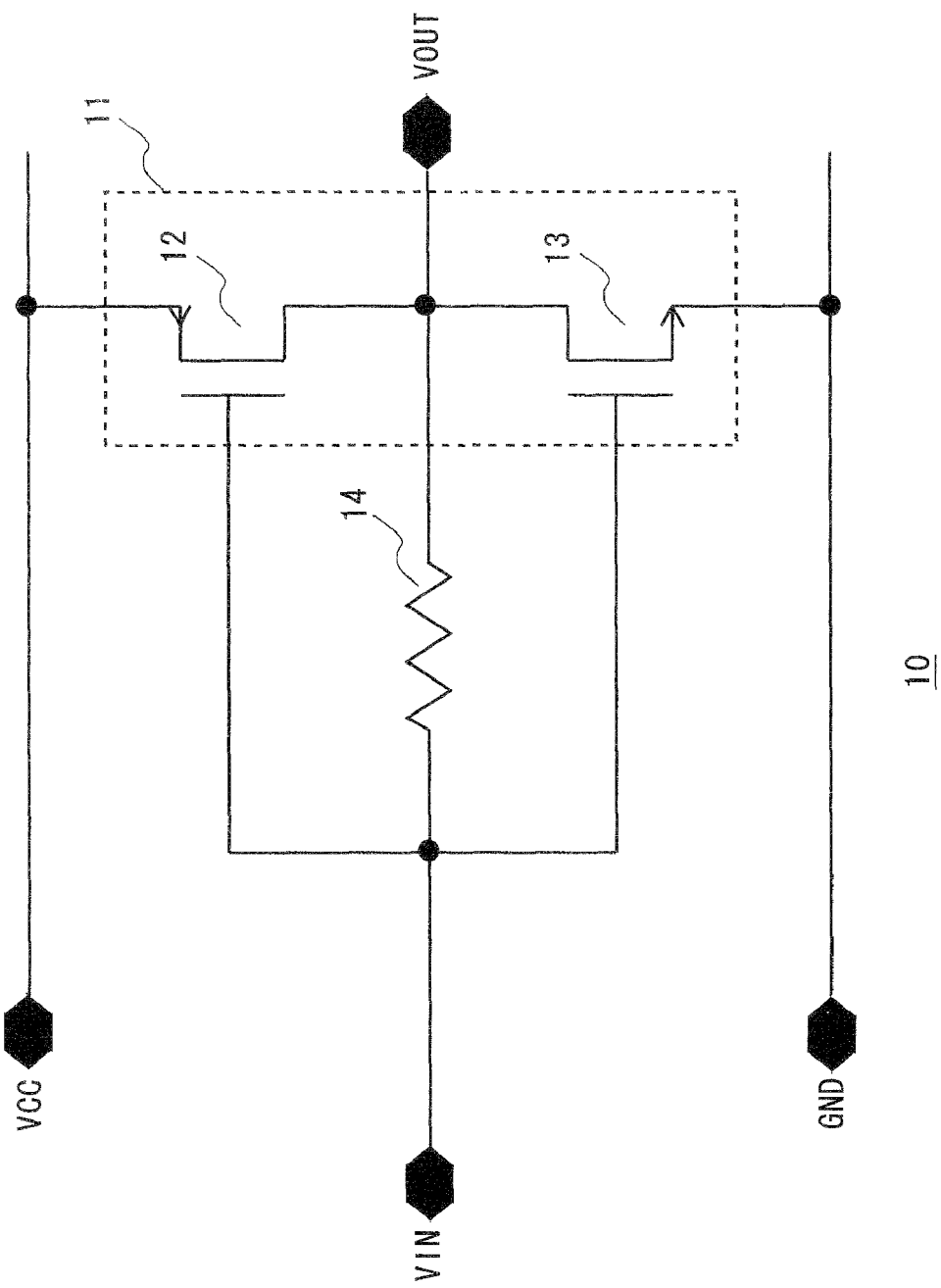
FIG. 7 is a schematic diagram of an amplifier in the related art.

An amplifier circuit 20 shown in FIG. 3 is an equivalent circuit to the amplifier 10 shown in FIG. 7 in a state where the NMOS transistor 12 and the PMOS transistor 13 operate in the saturation region. In the amplifier circuit 20, a pair of a constant current source 21 and a resistor R01 is equivalent to the NMOS transistor 12 of the amplifier 10, and a pair of a constant current source 22 and a resistor R02 is equivalent to the PMOS transistor 13 of the amplifier 10.

Figure 8:
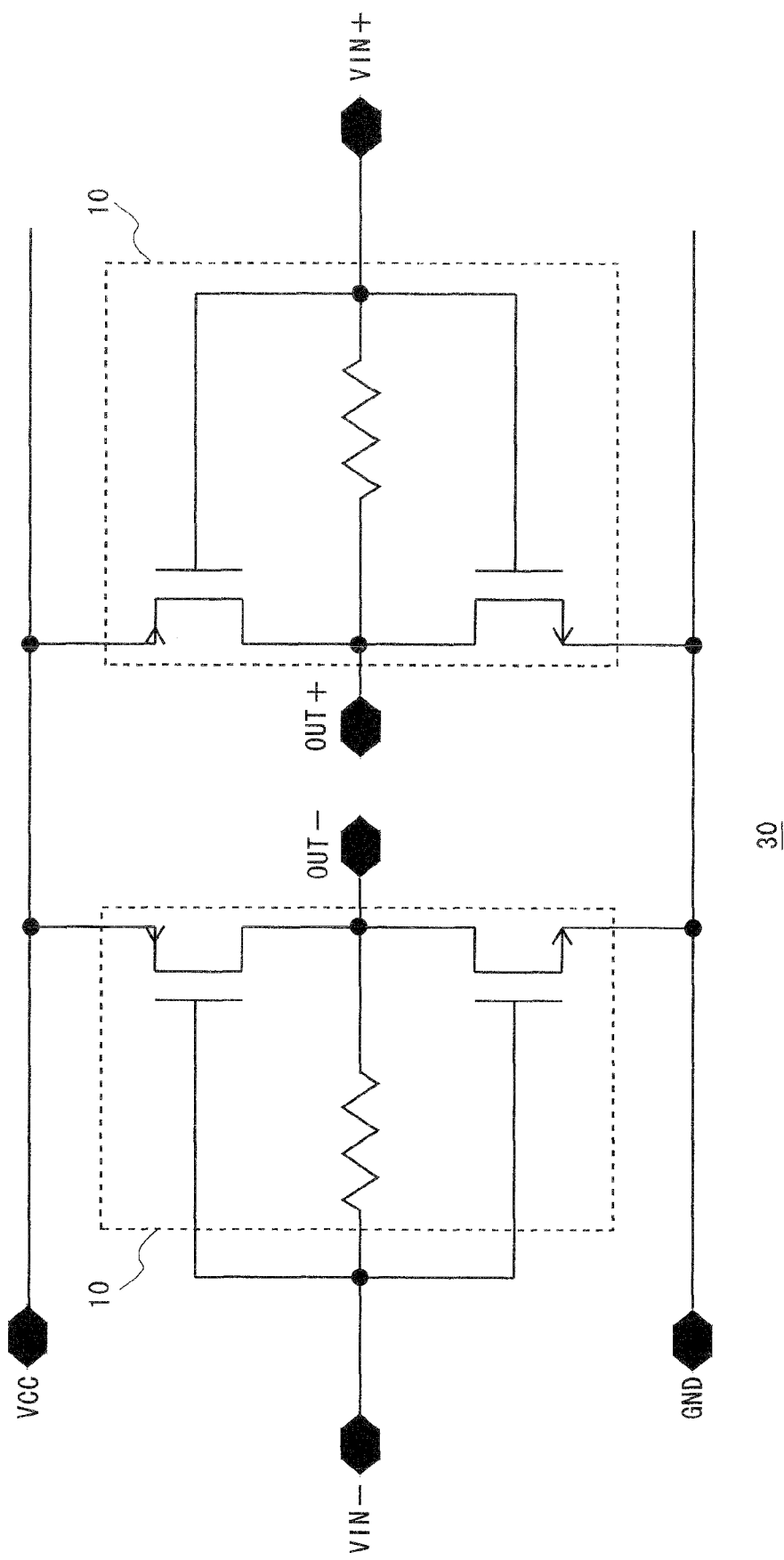
FIG. 8 is a schematic diagram of a differential amplifier in the related art.

As can be seen from FIG. 3, fluctuations in the power supply voltage VCC or the ground voltage GND are directly propagated to the output voltage VOUT through the resistor R01 and the resistor R02. Therefore, it has a problematically low PSRR. The same problem also arises in the differential amplifier 30 shown in FIG. 8.

By contrast to this, the control signal from the control signal terminal PS has a constant level in the normal operating mode in the amplifier circuit 100, so that the magnitude of the current flowing from the power supply voltage VCC to the ground voltage GND is determined as a constant value by the capabilities of the NMOS transistor 142 and the PMOS transistor 144 in the On state. Therefore, the bias current is stable. Therefore, the upper limit of the transient current is restricted in the amplifier circuit 100, and the fluctuation range of the transient current becomes narrower.

Since the fluctuation range of the transient current is narrowed, the influence of the fluctuation in the power supply voltage VCC and the ground voltage GND on the output of the amplifier circuit 100 is also weakened, so that the PSRR becomes higher.

Figure 4:
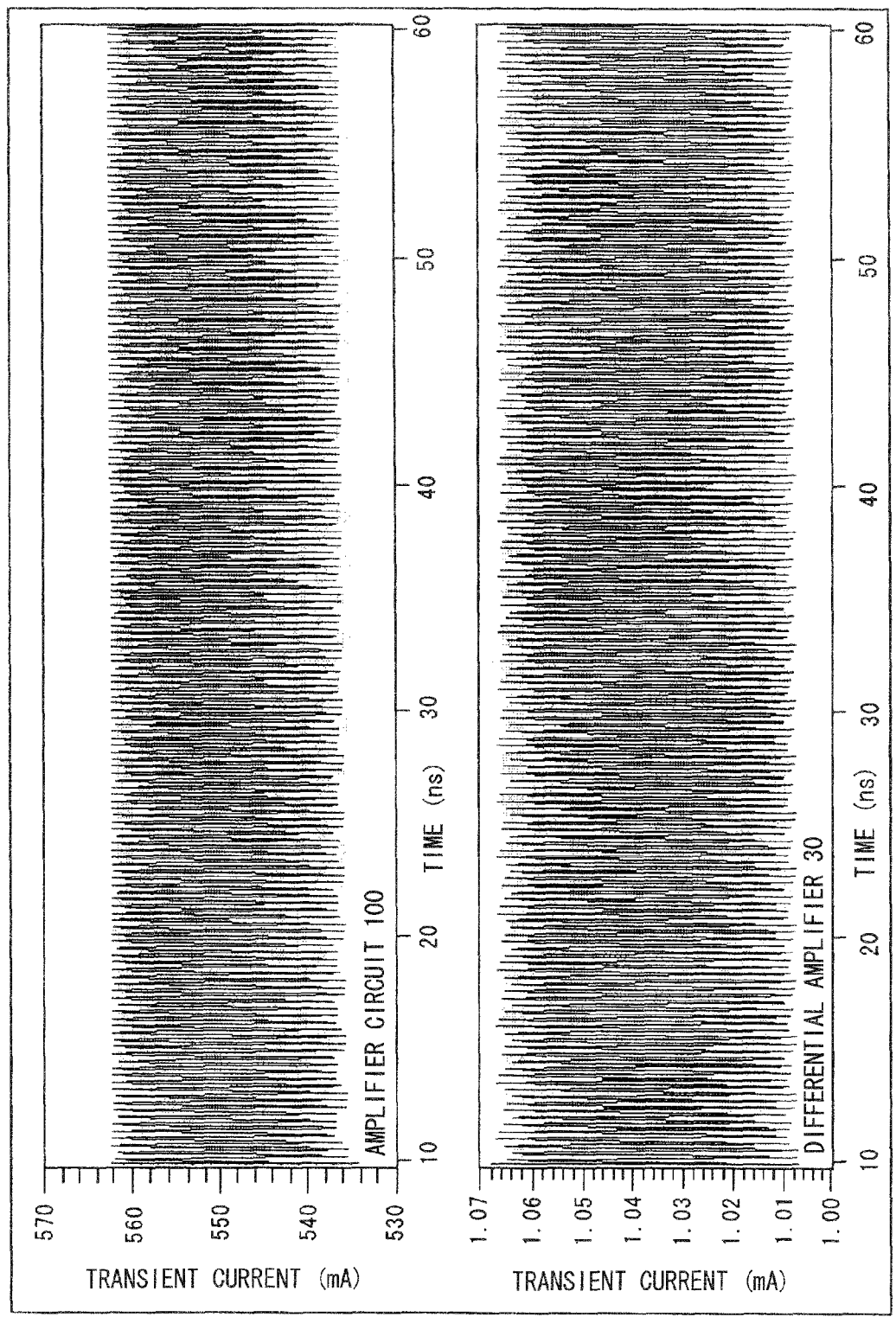
FIG. 4 is a graph comparing a transient current in the amplifier circuit shown in FIG. 1 with that in a differential amplifier circuit in the related art.

FIG. 4 shows a transient current in the amplifier circuit 100 in the normal operating mode 100 and a transient current in the differential amplifier 30. Similarly to FIG. 2, FIG. 4 shows a case where the same transistors and the same negative feedback resistors are used in both the differential amplifier circuit 110 of the amplifier circuit 100 and the differential amplifier 30. As shown in the figure, the transient current of the differential amplifier 30 fluctuates between about 1.007 mA and about 1.067 mA. By contrast to this, the transient current fluctuates between about 534 µA and about 562 µA in the amplifier circuit 100, indicating that the fluctuation range of the transient current is remarkably narrower than that of the differential amplifier 30.

Figure 5:
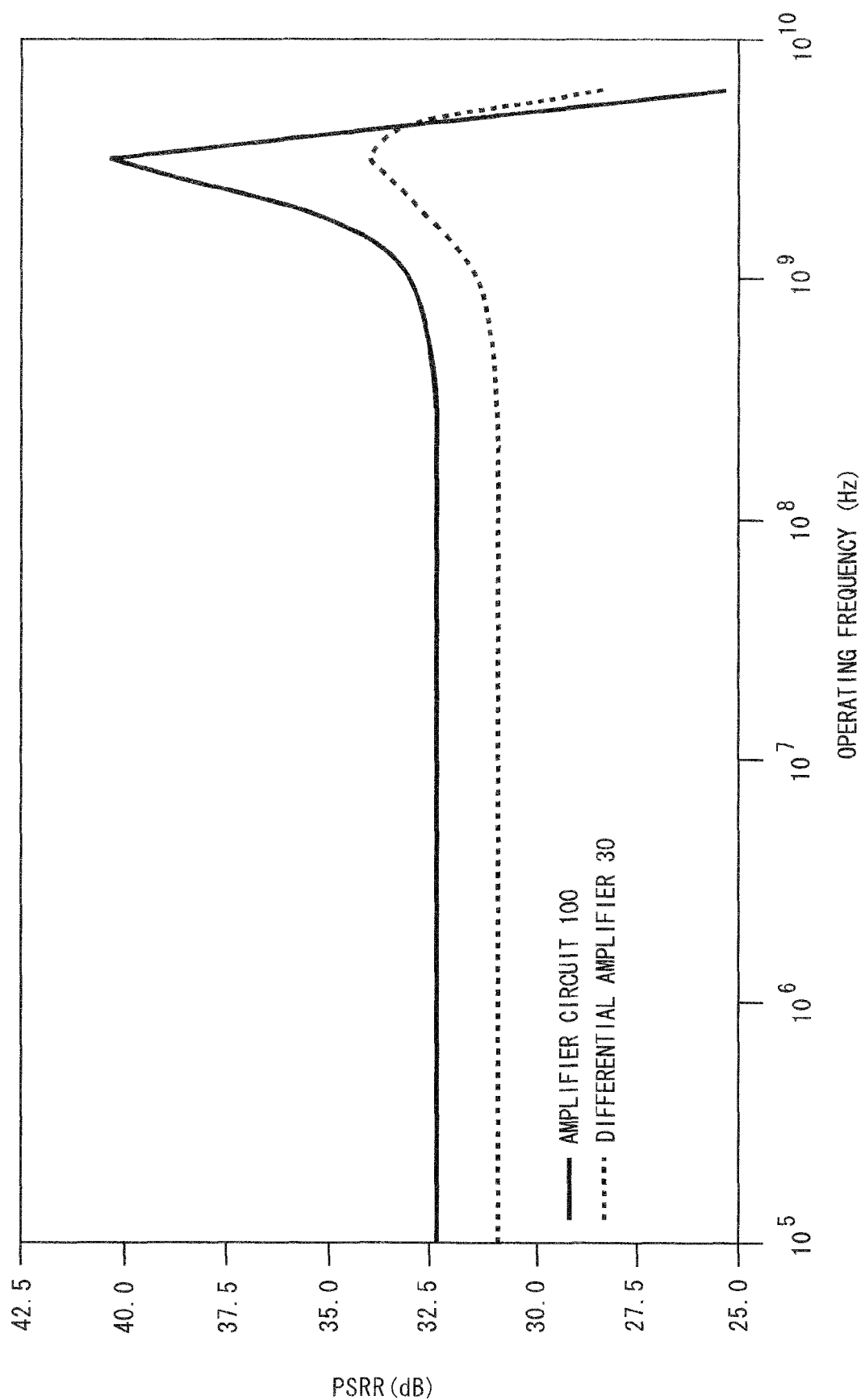
FIG. 5 is a graph comparing a PSRR (Power Supply Ripple Rejection) rate in the amplifier circuit shown in FIG. 1 with that in a differential amplifier circuit in the related art.

As a result, as shown in FIG. 5, the amplifier circuit 100 has a higher PSRR than that of the differential amplifier 30 over a wide operating frequency range.

Figure 6:
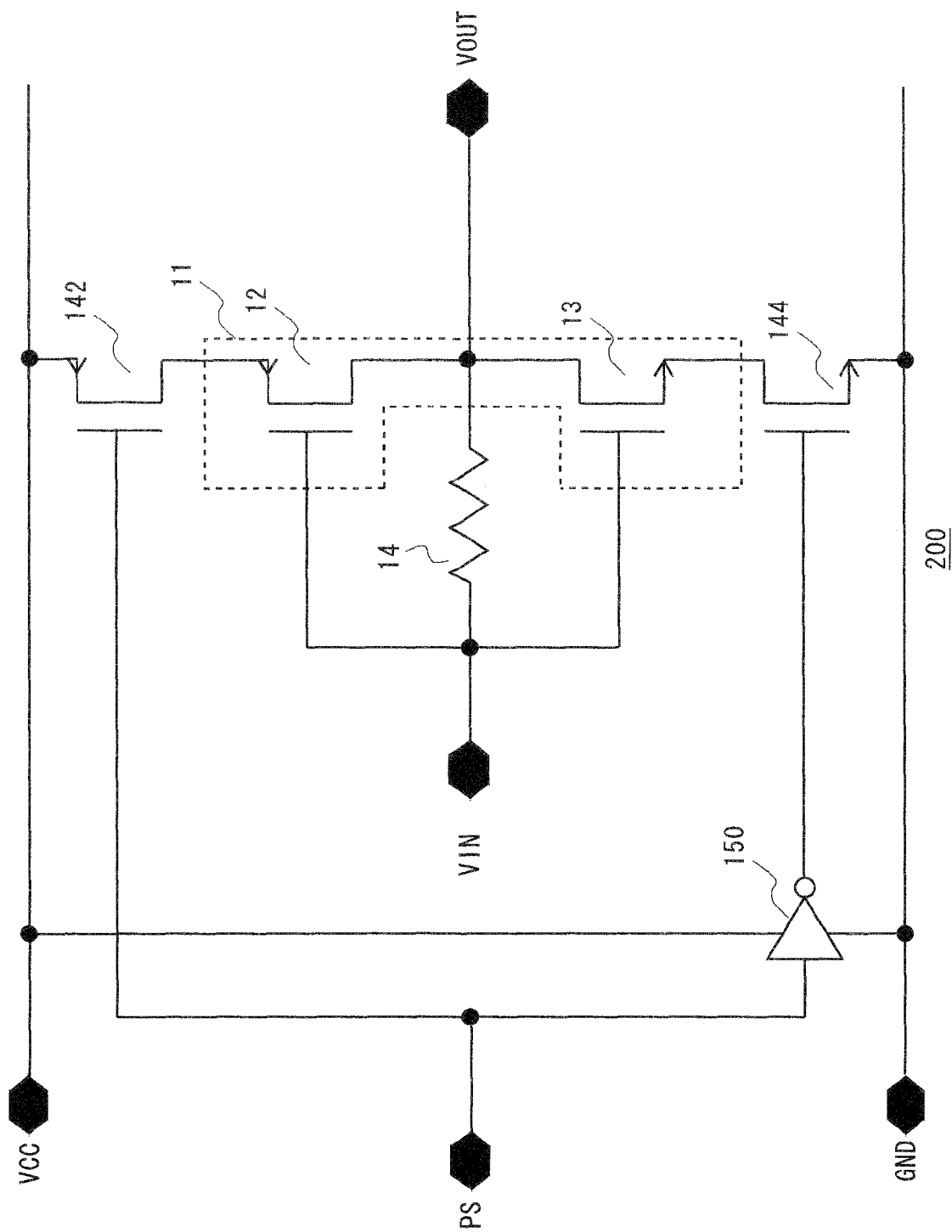
FIG. 6 shows an amplifier circuit in accordance with another exemplary embodiment of the present invention.

The amplifier circuit 100 is an example to which a technique in accordance with an exemplary aspect of the present invention is applied. A technique in accordance with an exemplary aspect of the present invention can be also applied to the amplifier 10 shown in FIG. 7. FIG. 6 shows an amplifier circuit 300 that is obtained by applying the NMOS transistor 142, the PMOS transistor 144, and the inverter 150 in the amplifier circuit 100 shown in FIG. 1 to the amplifier 10 shown in FIG. 7. In FIG. 6, the same signs are assigned to the same structures as those in the amplifier circuit 100 shown in FIG. 1 and the amplifier 10 shown in FIG. 7.

In the amplifier circuit 300 shown in FIG. 6, the circuit current is eliminated by performing similar control to that of the amplifier circuit 100 by using a control signal from the control signal terminal PS, so that the power consumption is also reduced. In addition, the fluctuation range of the transient current is narrowed, so that the PSRR can be increased.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An amplifier circuit comprising:
   a first switch circuit;
   a second switch circuit; and
   an amplifier connected to a first power supply voltage and a second power supply voltage through the first switch circuit and the second switch circuit respectively, the amplifier being composed of an inverter;
   wherein the first and second switch circuits are configured such that they can be cut off simultaneously.

2. The amplifier circuit according to claim 1, wherein the first and second switch circuit are CMOS transistors.

3. The amplifier circuit according to claim 2, further comprising:
   an input terminal for a control signal; and
   an inverter connected to the input terminal;
   wherein a gate of one of the first and second switch circuits is connected to the input terminal, and a gate of the other of the first and second switch circuits is connected to the input terminal through the inverter.

4. The amplifier circuit according to claim 1, wherein the inverter comprises a negative feedback circuit.

5. The amplifier circuit according to claim 2, wherein the inverter comprises a negative feedback circuit.

6. The amplifier circuit according to claim 3, wherein the inverter comprises a negative feedback circuit.

7. The amplifier circuit according to claim 4, wherein the amplifier is a differential amplifier being composed of two inverters.

8. The amplifier circuit according to claim 5, wherein the amplifier is a differential amplifier being composed of two inverters.

9. The amplifier circuit according to claim 6, wherein the amplifier is a differential amplifier being composed of two inverters.

* * * * *